United States Patent [19]

Nakayama et al.

[11] Patent Number: 5,858,617

[45] Date of Patent: Jan. 12, 1999

[54] PHOTOPOLYMERIZABLE COMPOSITION AND PRESENSITIZED PLANOGRAPHIC PRINTING PLATE EMPLOYING THE SAME

[75] Inventors: Noritaka Nakayama; Mitsunori Matsuura; Shinji Matsumoto, all of Hino, Japan

[73] Assignee: Konica Corporation, Japan

[21] Appl. No.: 812,030

[22] Filed: Mar. 6, 1997

[30] Foreign Application Priority Data

Mar. 12, 1996 [JP] Japan ...................................... 8-054648

[51] Int. Cl.$^6$ .................................................. G03C 1/725
[52] U.S. Cl. ...................... 430/281.1; 430/300; 430/915; 430/916; 430/920; 522/24; 522/25; 522/26; 522/50; 522/63
[58] Field of Search ................................ 430/281.1, 300, 430/915, 916, 919, 920; 522/63, 24, 25, 29, 26, 50

[56] References Cited

U.S. PATENT DOCUMENTS

| | | | |
|---|---|---|---|
| 4,522,694 | 6/1985 | Schaefer | 204/159.24 |
| 4,607,003 | 8/1986 | Ukai et al. | 430/519 |
| 4,772,541 | 9/1988 | Gottschalk et al. | 430/339 |
| 4,886,735 | 12/1989 | Boettcher et al. | 430/332 |

FOREIGN PATENT DOCUMENTS

| | | |
|---|---|---|
| 0366145 | 5/1990 | European Pat. Off. . |
| 0551697 | 7/1993 | European Pat. Off. . |

OTHER PUBLICATIONS

European Search Report EP 97 30 1586 and Annex Derwent Publication Ltd., AN 92–001941 XP002033235 & JP 03 249 752 A.

Primary Examiner—Janet Baxter
Assistant Examiner—Rosemary Ashton
Attorney, Agent, or Firm—Jordan B. Bierman; Bierman, Muserlian and Lucas

[57] ABSTRACT

A photopolymerizable composition and a presensitized planographic printing plate employing the same are disclosed which comprise a compound having an ethylenically unsaturated bond and a dye represented by the following formula (1) or (2):

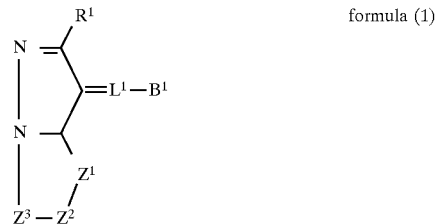

formula (1)

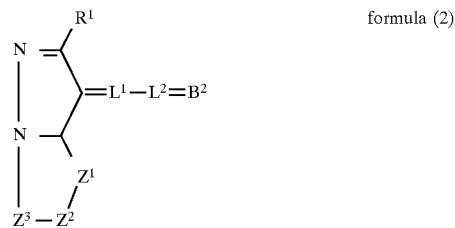

formula (2)

9 Claims, No Drawings

PHOTOPOLYMERIZABLE COMPOSITION AND PRESENSITIZED PLANOGRAPHIC PRINTING PLATE EMPLOYING THE SAME

FIELD OF THE INVENTION

The present invention relates to a photopolymerization initiator comprising a novel dye and a radical generating agent, a photopolymerizable composition, a radical generating method, a novel radical generating agent, a light sensitive composition for a presensitized planographic printing plate and a manufacturing method of a planographic printing plate, and particularly to a photopolymerizable composition comprising a radical generating agent, a pyrazoloazole methine or dimethine dye and a compound having an ethylenically unsaturated bond, which is useful for ink, a presensitized printing plate, a photoresist, a direct printing plate, a proof for graphic arts, a hologram material, a filling stuff, an adhesive or a photo-molding material and is capable of giving a photo-hardened composition with good physical properties by exposing to a visible light, and a method of manufacturing a planographic printing plate employing the photopolymerizable composition.

BACKGROUND OF THE INVENTION

Recently, use of a semiconductor laser or a YAG laser is increasing as an image recording laser in view of stability, compact and ease of maintenance. The technique shifting the wavelength of these lasers to shorter wavelength has been sought, and a laser (532 nm) employing SHG of a YAG laser is put into practical use. A method of forming an image is known which comprises the steps of exposing a photopolymerizable composition to a laser such as a semiconductor laser or a YAG laser to cause radical polymerization to harden at exposed portions, whereby difference of physical property between the exposed and unexposed portions is produced, and then to develop to form an image.

In order to form an image employing a laser exposure, a light sensitive composition suitable for a laser light wavelength is necessary, and a radical generating agent as a radical polymerization initiator has been studied. Most radical generating agents alone have absorption only at ultra violet wavelength regions. The agents are ordinarily used in combination with a sensitizing dye capable of absorbing a light emitted from a light source.

Various combinations (hereinafter referred to also as initiator compositions) of a sensitizing dye for a 488 nm argon laser or a 532 nm W-YAG laser with a radical generating agent are known. A specific photo-reducing dye as an effective sensitizing dye is described in U.S. Pat. No. 2,850,445. An initiator composition comprising a dye and amines is disclosed in Japanese Patent Publication No. 44-20189, an initiator composition comprising a biimidazole and a radical generating agent in Japanese Patent Publication No. 45-37377, an initiator composition comprising a biimidazole and dialkylaminobenzylideneketones in Japanese Patent Publication No. 47-2528 and Japanese Patent O.P.I. Publication No. 54-55292, an initiator composition comprising a keto-substituted cumarin and an active halogenated compound in Japanese Patent O.P.I. Publication No. 58-15503, and an initiator composition comprising a substituted triazine and a merocyanine dye in Japanese Patent O.P.I. Publication No. 54-15102. However, the above techniques have problems in sensitivity and storage stability.

A dye having a pyrazolo [1,5-b][1,2,4] triazole nucleus for a photographic material is disclosed in Japanese Patent O.P.I. Publication No. 60-213937, but there is no description therein that a combination of the dye with a radical generating agent can be used as a photopolymerization initiator. Further, there is no description therein of a dye having a pyrazolo [3,2-b][1,2,4] triazole nucleus. It is unexpected that these dyes have a capability of generating a radical.

SUMMARY OF THE INVENTION

The present invention has been made to solve the above problems.

A first object of the invention is to provide a photopolymerizable composition with high sensitivity which is capable of writing with a 488 or approx. 532 nm light and forming an excellent image with high resolution.

A second object of the invention is to provide a photopolymerizable composition with good storage stability.

A third object of the invention is to provide a radical generating method of generating a radical by exposing to a 488 or approx. 532 nm light.

A fourth object of the invention is to provide a light sensitive material for a presensitized planographic printing plate with high sensitivity to a 488 or approx. 532 nm light and with excellent storage stability and a manufacturing method of planographic printing plate employing the light sensitive material.

A fifth object of the invention is to provide a photopolymerizable initiator with high sensitivity.

A sixth object of the invention is to provide a novel radical generating agent.

DETAILED DESCRIPTION OF THE INVENTION

The present inventors have made an extensive study and have found that a specific pyrazoloazole methine or dimethine dye alone absorbs a 488 or 532 nm visible light and has a radical generating capability. Further, the present inventors have found that a combination of such a dye with a conventional radical generating agent shows the unexpected results providing high sensitivity and excellent storage stability, and have attained the present invention.

The object of the invention can be attained by the following constitution:

1. A photopolymerization initiator comprising a radical generating agent and a dye represented by the following formula (1) or (2):

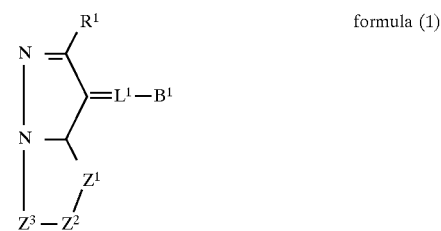

formula (1)

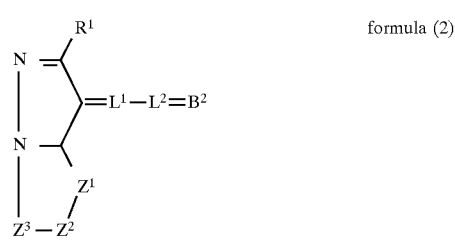

formula (2)

wherein $Z^1$, $Z^2$ and $Z^3$ independently represent —N= or —C($R^2$)=; $R^1$ and $R^2$ independently represent a hydrogen atom or a monovalent substituent, the monovalent substituent representing an alkyl group, an alkenyl group, an aryl group or a heterocyclic ring residue; $L^1$ and $L^2$ independently represent a methine group; and $B^1$ and $B^2$ independently represent an aryl group or a 5- or 6- membered heterocyclic ring residue, 2. The photopolymerization initiator of 1 above, further containing an amine compound as a polymerization promoting agent,
3. The photopolymerization initiator of 1 or 2 above, further containing a sulfur compound as a polymerization promoting agent,
4. A photopolymerizable composition comprising the photopolymerization initiator of 1, 2 or 3 above and a compound having an ethylenically unsaturated bond,
5. The photopolymerizable composition of 1, 2, 3 or 4 above, wherein the radical generating agent is selected from the group consisting of an organic peroxide, an onium compound, a halogenated triazine, an iron arene complex, a bisimidazole and a titanocene compound,
6. A photopolymerizable composition comprising a compound having an ethylenically unsaturated bond and a dye represented by formula (1) or (2),
7. The photopolymerizable composition of claim 6, further containing a radical generating agent,
8. The photopolymerizable composition of claim 6, further containing an amine compound or a sulfur compound as a polymerization promoting agent,
9. A method for generating a radical, the method comprising the step of exposing the photopolymerization initiator of 1, 2, or 3 above to a 488 nm or 532 nm laser light,
10. A light sensitive composition of a presensitized planographic printing plate comprising a hydrophilic support and provided thereon, a light sensitive layer and a protective layer in that order, wherein the light sensitive layer contains a compound having at least one ethylenically unsaturated bond, a binder and the photopolymerizable composition of 4 or 5 above,
11. A method for manufacturing a planographic printing plate, the method comprising the steps of imagewise exposing the light sensitive layer of the presensitized planographic printing plate of 10 above to a 488 nm or 532 nm laser light and then dissolving the protective layer and light sensitive layer at unexposed portions to remove,
12. A dye represented by the following formula (G):

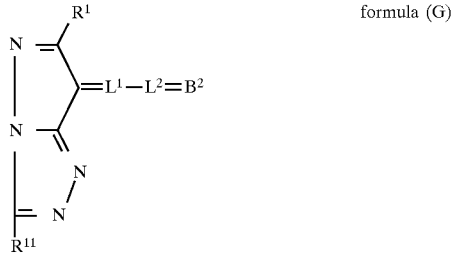

wherein $R^1$, $R^{11}$, $L^1$, $L^2$ and $B^2$ independently represent those as denoted in $R^1$, $R^2$, $L^1$, $L^2$ and $B^2$ of formula (2) above, respectively, or 13. A method for generating a radical, the method comprising the step of exposing the radical generating agent of 12 above to a light which the agent absorbs.

The invention will be detailed below. The dye (sensitizing dye) represented by formula (1) or (2) will be explained.

The following formula (3) shows a part of formula (1) or (2).

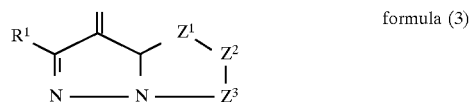

wherein $Z^1$, $Z^2$, $Z^3$ and $R^1$ represent those as denoted in $Z_1$, $Z^2$, $Z^3$ and $R^1$ of formula (1) or (2), respectively. The formula (3) is preferably represented by the following formula (3-1), (3-2), (3-3), (3-4), (3-5) or (3-6):

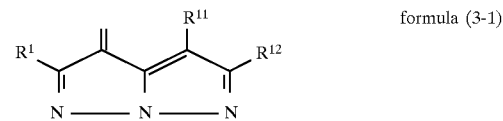

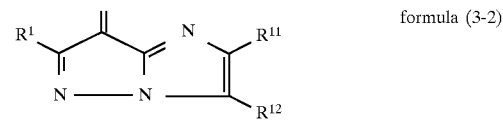

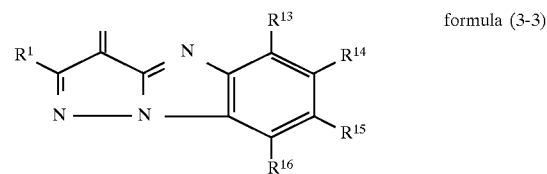

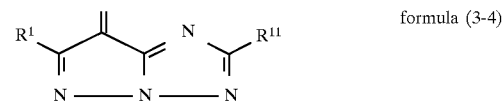

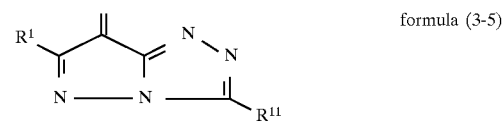

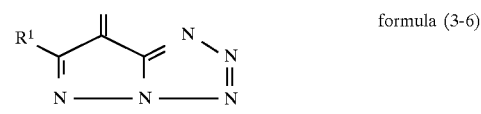

wherein $R^{11}$, $R^{12}$, $R^{13}$, $R^{14}$, $R^{15}$ and $R^{16}$ independently represent a hydrogen atom or a non-metallic substituent, provided that $R^{11}$ and $R^{12}$, $R^{13}$ and $R^{14}$, $R^{14}$ and $R^{15}$, or $R^{15}$ and $R^{16}$ may combine with each other to form a 5- or 6-membered ring. The example of the non-metallic substituent represented by $R^{11}$ or $R^{12}$ includes an alkyl group, an alkenyl group, an aryl group or a 5- or 6-membered heterocyclic ring residue. The example of the non-metallic substituent represented by $R^{13}$, $R^{14}$, $R^{15}$ or $R^{16}$ includes a halogen atom, an alkyl group, an alkenyl group, an aryl group or a 5- or 6-membered heterocyclic ring residue.

The 5- or 6-membered heterocyclic ring residue represented by $B^1$ or $B^2$ in formula (1) includes a group represented by the following formula (4):

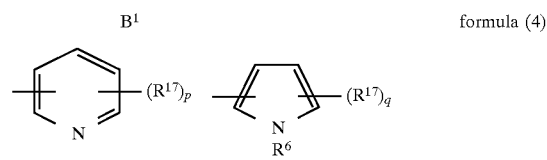

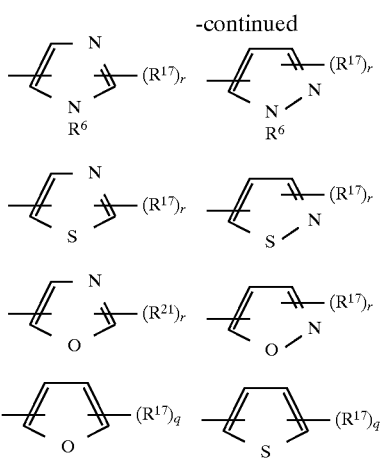

wherein $R^{17}$ represents a hydrogen atom, an alkyl group, an aryl group, $-OR^{18}$, $-SR^{18}$ or $-N(R^{19})(R^{20})$ in which $R^{18}$, $R^{19}$ and $R^{20}$ independently represent a hydrogen atom, an alkyl group or an aryl group; p represents an integer of 0 to 4; q represents an integer of 0 to 3; and r represents an integer of 0 to 2, provided that plural $R^{17}$ may be the same or different and combine with each other to form a ring.

In formula (1), (2), (3) or (4) or formula (G), the alkyl group represented by $R^1$, $R^2$, $R^{11}$, $R^{12}$, $R^{13}$, $R^{14}$, $R^{15}$, $R^{16}$, $R^{17}$, $R^{18}$, $R^{19}$ and $R^{20}$ is preferably a straight-chained or branched alkyl group having 1 to 12 carbon atoms (for example, methyl, ethyl, benzyl, phenetyl, propyl, isopropyl, butyl, isobutyl, pentyl, hexyl, octyl, nonyl, cyclopropyl, cyclopentyl or cyclohexyl), which may have a substituent.

The aryl group represented by $R^1$, $R^2$ or $R^{11}$ through $R^{20}$ is preferably an aryl group having 6 to 12 carbon atoms (for example, phenyl or naphthyl), which may have a substituent.

The heterocyclic group represented by $R^1$, $R^2$, $R^{11}$, $R^{12}$, $R^{13}$, $R^{14}$, $R^{15}$ or $R^{16}$ is preferably a 5- or 6-membered heterocyclic group (for example, oxazole, benzoxazole, thiazole, imidazole, pyridine, furan, thiophene, sulfolane, pyrazole, pyrrole, chroman or cumarin), which may have a substituent.

The alkenyl group represented by $R^1$, $R^2$, or $R^{11}$ through $R^{16}$ is preferably an alkenyl group having 2 to 12 carbon atoms (for example, vinyl, allyl, 1-propenyl, 2-pentenyl or 1,3-butadienyl).

The halogen atom represented by $R^{13}$, $R^{14}$, $R^{15}$ or $R^{16}$ is preferably fluorine, chlorine or bromine.

The methine group represented by $L^1$ or $L^2$ may be substituted or unsubstituted.

The substituent which each of the above group may have includes a carboxyl group, a sulfonamide group having 1 to 12 carbon atoms (for example, methanesulfonamide, benzenesulfonamide, butanesulfonamide or octanesulfonamide), a sulfamoyl group having 0 to 12 carbon atoms (for example, sulfamoyl, methylsulfamoyl, phenylsulfamoyl or butylsulfamoyl), a sulfonylcarbamoyl group having 2 to 12 carbon atoms (for example, methanesulfonylcarbamoyl, propanesulfonylcarbamoyl or benzenesulfonylcarbamoyl), an acylsulfamoyl group having 1 to 12 carbon atoms (for example, acetylsulfamoyl, propionylsulfamoyl, pivaloylsulfamoyl or benzoylsulfamoyl), a straight-chained or branched alkyl group having 1 to 12 carbon atoms (for example, methyl, ethyl, isopropyl, butyl, hexyl, cyclopropyl, cyclopentyl, cyclohexyl, 2-hydroxyethyl, 4-carboxybutyl, 2-methoxyethyl, benzyl, phenetyl, 4-carboxybenzyl or 2-diethylaminoethyl), an alkenyl group having 2 to 12 carbon atoms (for example, vinyl, allyl or butenyl), an alkoxy group having 1 to 12 carbon atoms (for example, methoxy, ethoxy or butoxy), a halogen atom (for example, fluorine, chlorine or bromine), an amino group having 0 to 12 carbon atoms (for example, amino, dimethylamino, diethylamino or carboxyethylamino), an ester group having 2 to 12 carbon atoms (for example, methoxycarbonyl or ethoxycarbonyl), an amido group having 1 to 12 carbon atoms (for example, acetylamino or benzamido), a carbamoyl group having 1 to 12 carbon atoms (for example, carbamoyl, methylcarbamoyl or phenylcarbamoyl), an aryl group having 6 to 12 carbon atoms (for example, phenyl, naphthyl, 4-carboxyphenyl, 3,5-dicarboxyphenyl, 4-methoxyphenyl or 4-methanesulfonamidophenyl), an aryloxy group having 6 to 10 carbon atoms (for example, phenoxy, 4-carboxyphenoxy, 4-methylphenoxy or naphthoxy), an alkylthio group having 1 to 8 carbon atoms (for example, methylthio, ethylthio or octylthio), an arylthio group having 6 to 10 carbon atoms (for example, phenylthio or naphthylthio), an acyl group having 1 to 10 carbon atoms (for example, acetyl, benzoyl, propanoyl or pivaloyl), a sulfonyl group having 1 to 10 carbon atoms (for example, methanesulfonyl or benzenesulfonyl), a ureido group having 1 to 10 carbon atoms (for example, ureido or methyl ureido), a urethane group having 2 to 10 carbon atoms (for example, methoxycarbonylamino or ethoxycarbonylamino), a cyano group, a hydroxy group, a nitro group, and a heterocyclic group (for example, 5-carboxybenzoxazole, pyridine, sulfolane, furan, pyrrole, pyrrolidine, morpholine, piperazine or pyrimidine).

The 5- or 6-membered ring, which $R^{11}$ and $R^{12}$, $R^{13}$ and $R^{14}$, $R^{14}$ and $R^{15}$, or $R^{15}$ and $R^{16}$ combine with each other to form, includes pyrrolidine, piperizine, benzene or morpholine.

Of these dyes, the dye represented by formula (G) is preferable, since it can generate a radical alone.

The example of the dye (hereinafter referred to as the dye of the invention) represented by formula (1) or (2) is listed below.

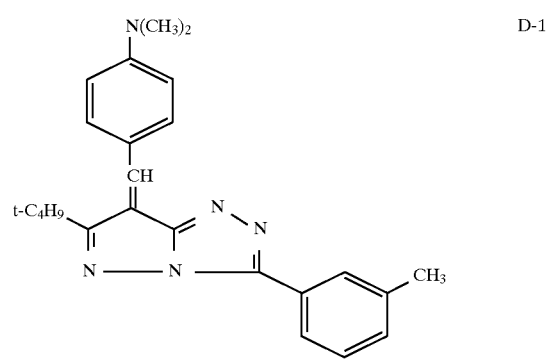

D-1

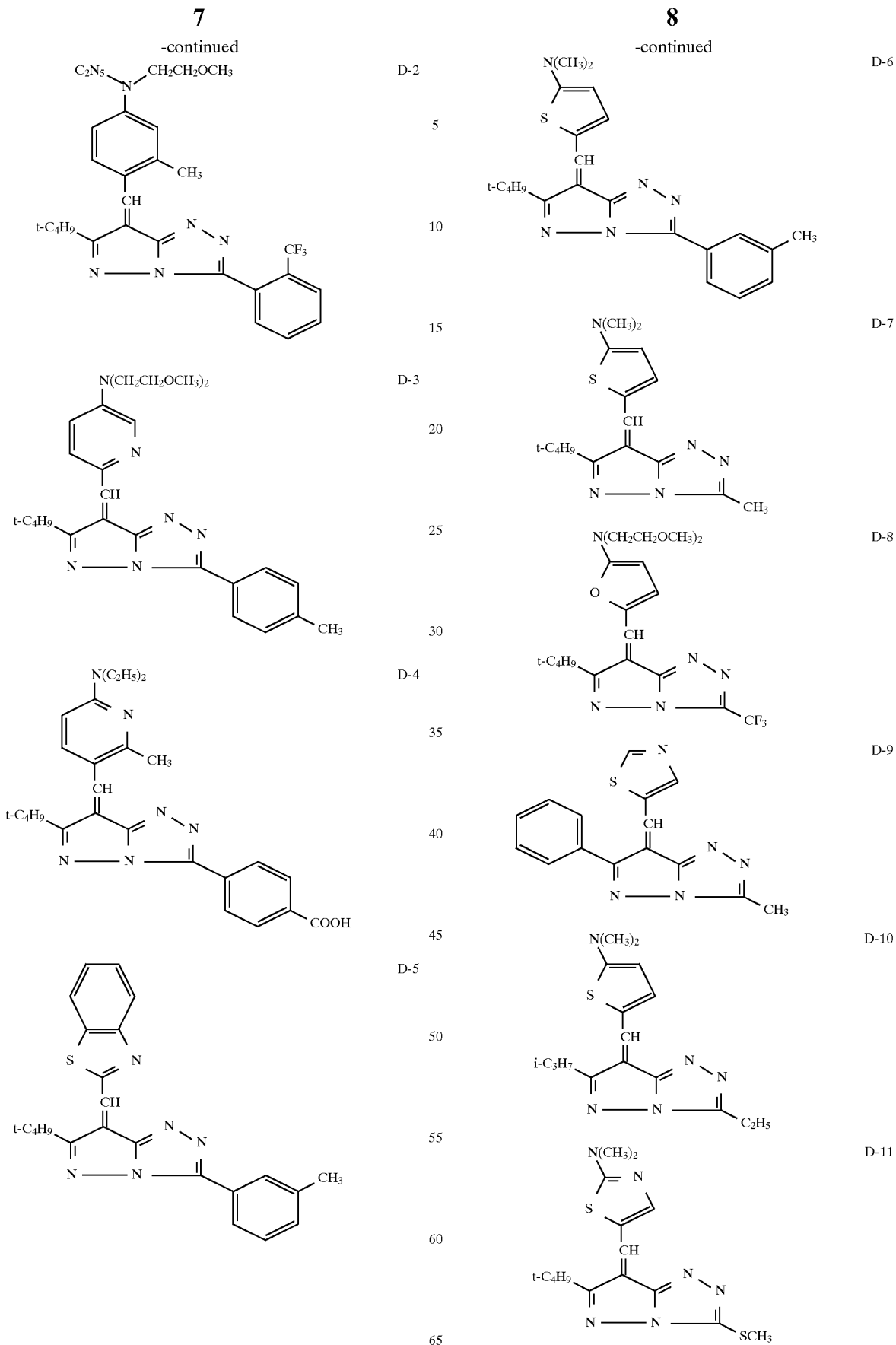

-continued
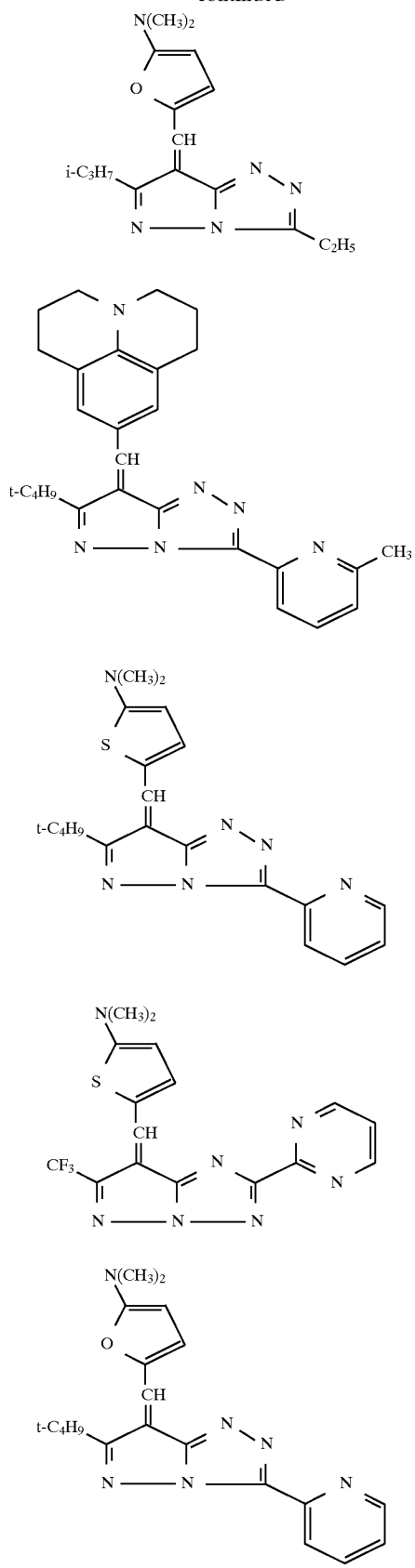
D-12
D-13
D-14
D-15
D-16
-continued
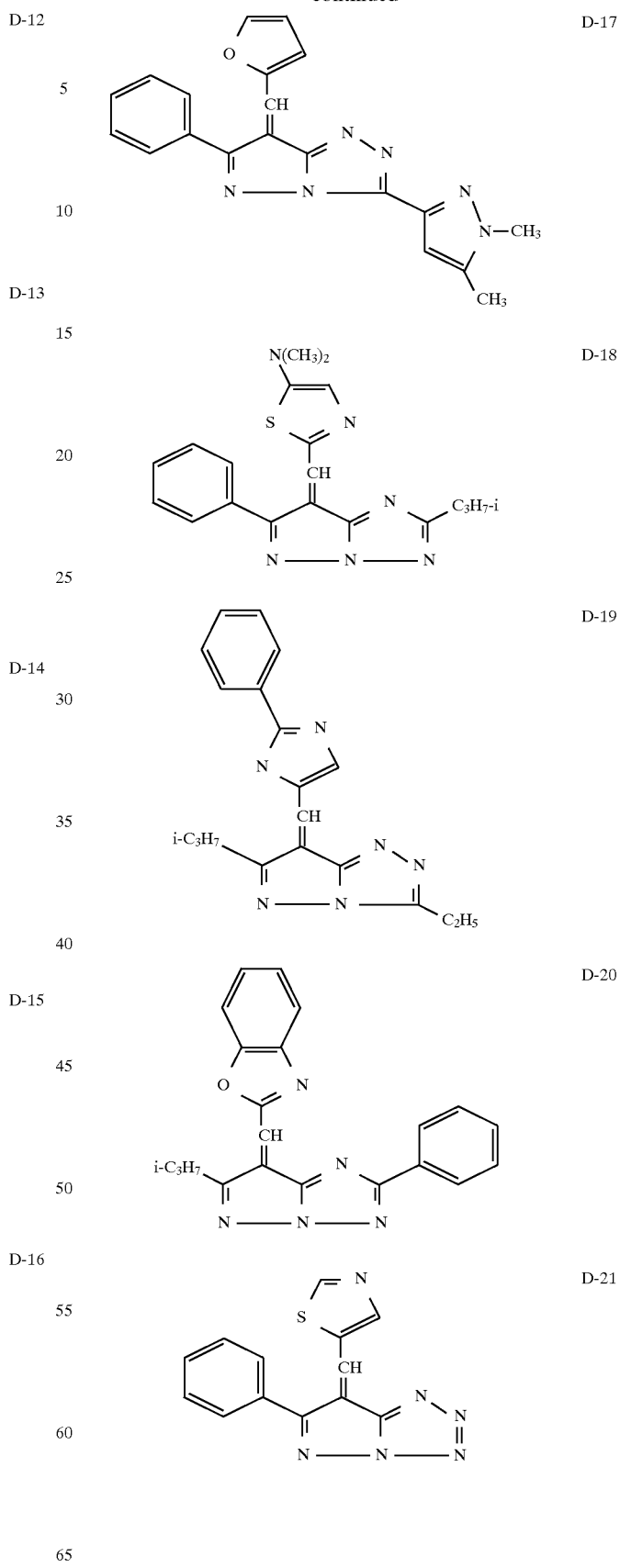
D-17
D-18
D-19
D-20
D-21

-continued
D-22
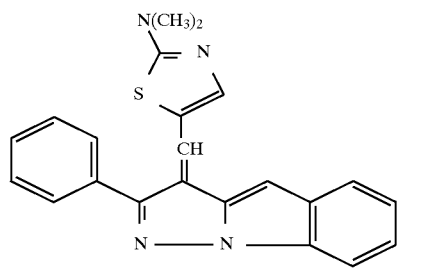
D-23
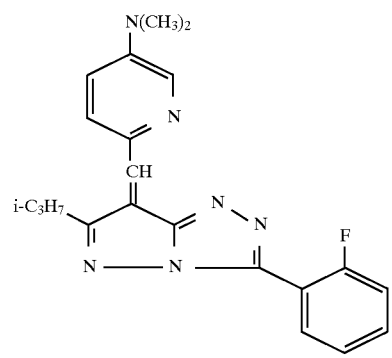
D-24
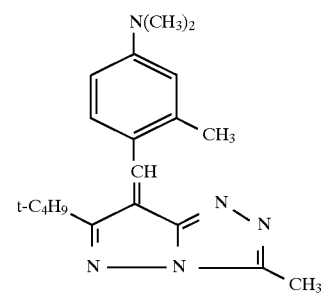
D-25
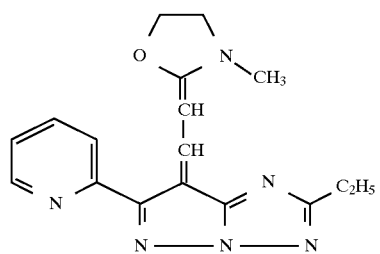
D-26
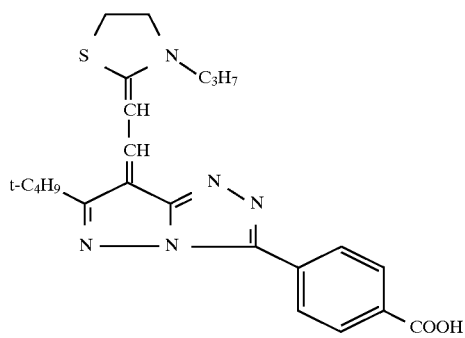
-continued
D-27
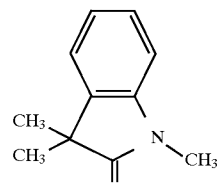
D-28
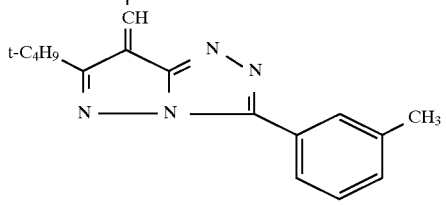
D-29
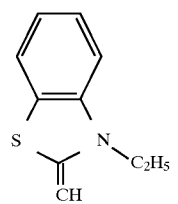
D-29
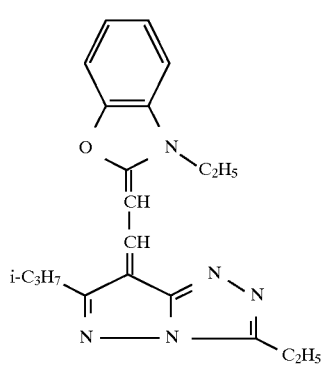
D-30
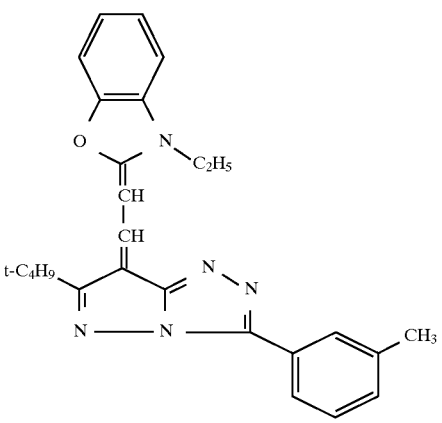

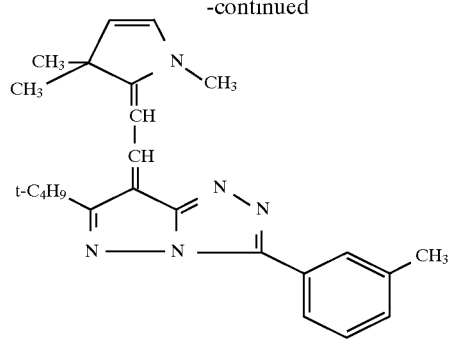
D-31
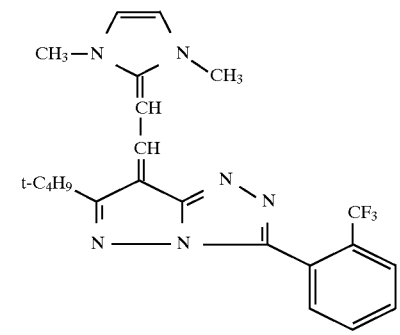
D-32
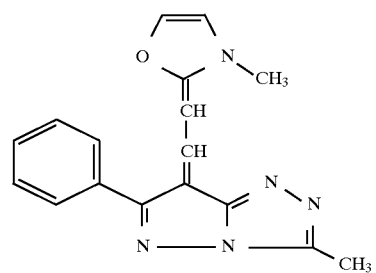
D-33
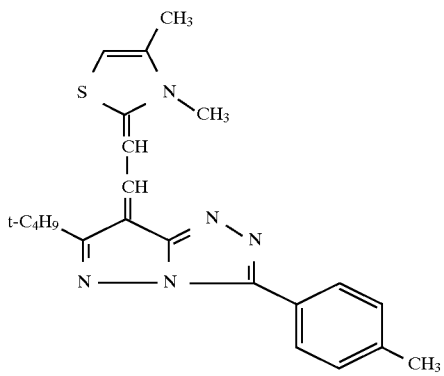
D-34
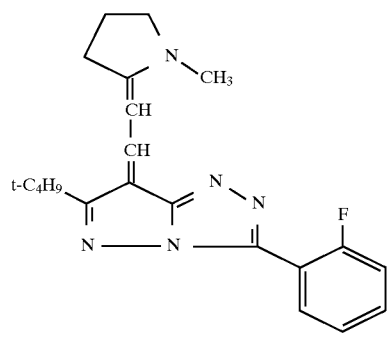
D-35
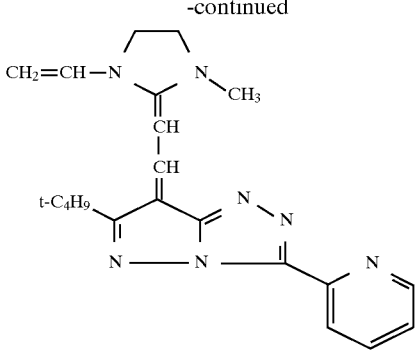
D-36
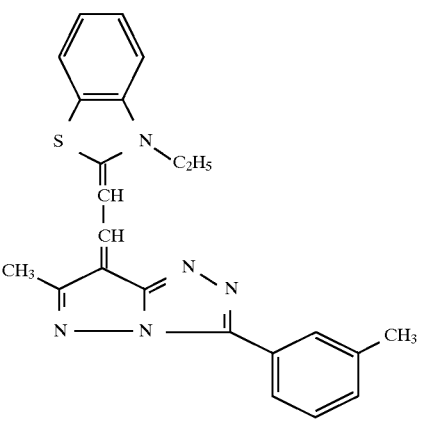
D-37
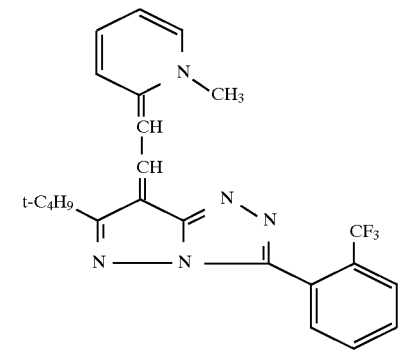
D-38
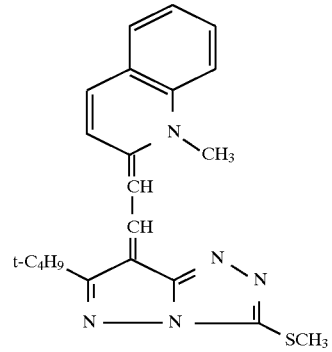
D-39

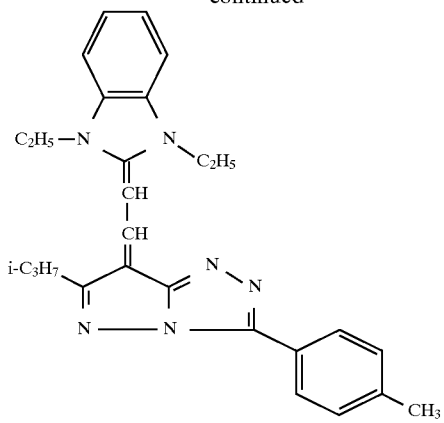
D-40
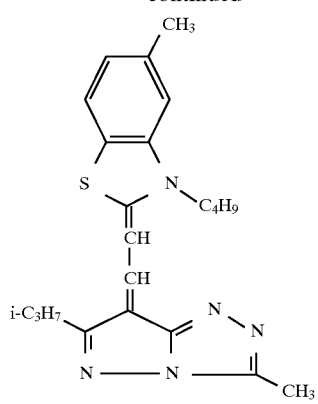
D-44
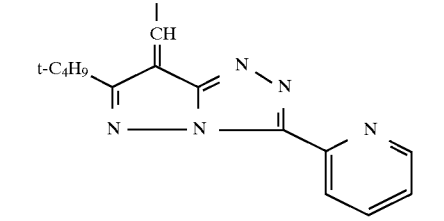
D-41
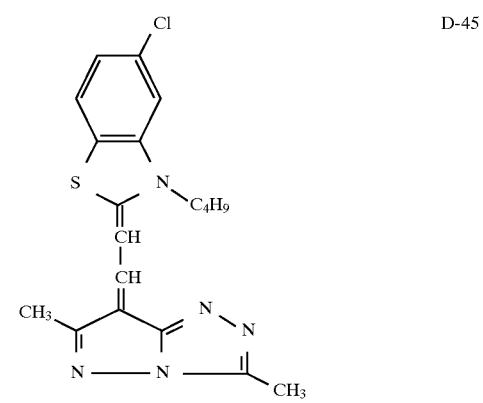
D-45
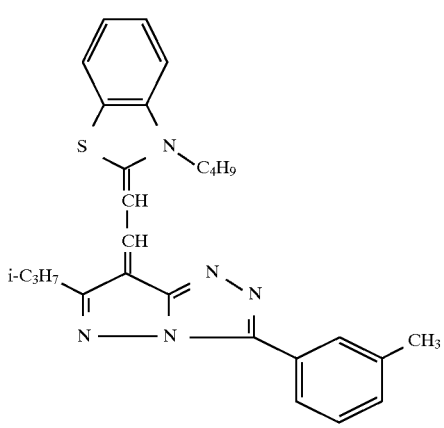
D-42
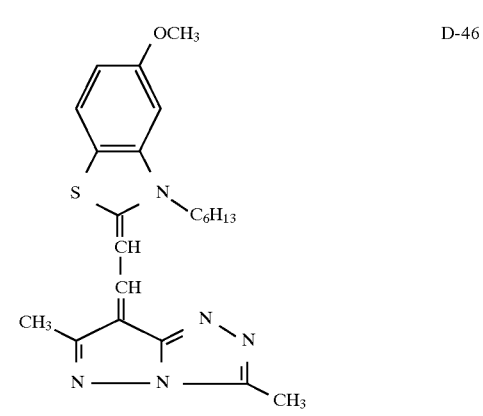
D-46
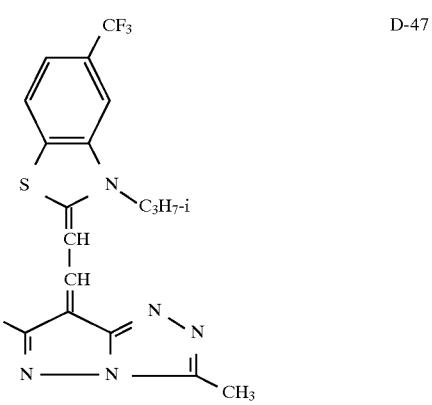
D-43
D-47

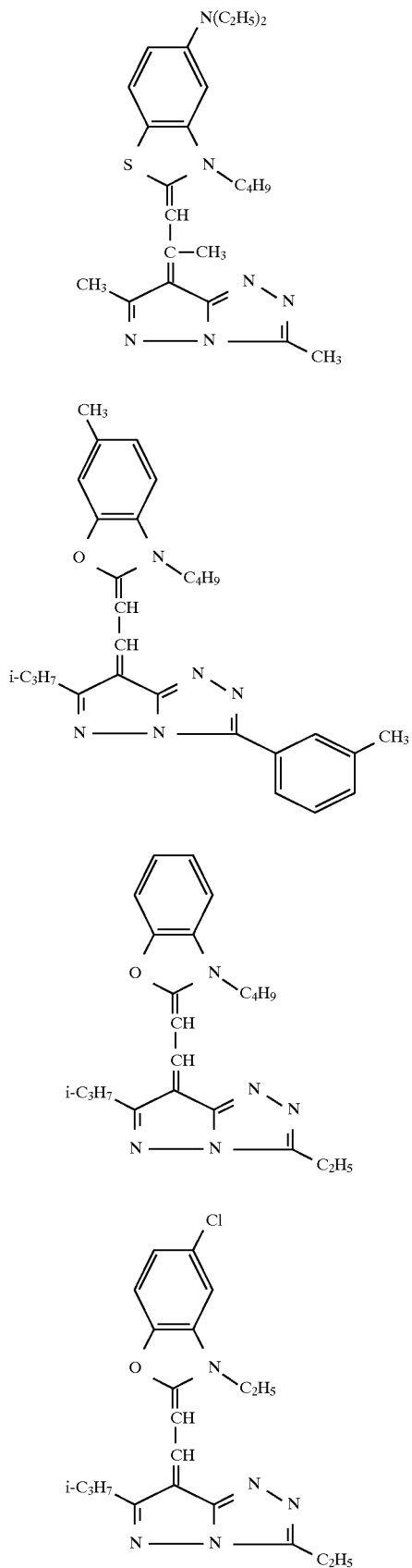

The dye content of the composition is preferably 0.1 to 20 parts by weight, and more preferably 1 to 10 parts by weight, based on the 100 parts by weight of the compound having an ethylenically unsaturated bond.

The dye of the invention can be synthesized according to a conventional method. The synthetic example will be shown below.

Synthetic Example 1 (Synthesis of D-10)

In 25 ml of toluene were dispersed 12.00 g (11.2 mmol) of Compound (1) and 21.74 g (11.2 mmol) of Compound (2), and 0.96 g (11.2 mmol) of piperidine were added. The resulting mixture was refluxed for one hour, and cooled to produce precipitates. The precipitates were filtered out, washed a small amount of toluene and recrystallized from ethanol. Thus, Dye, D-10 was obtained as a deep red solid. The yield was 2.22 g (63%).

Synthetic Example 2 (Synthesis of D-28)

In 50 ml of ethanol were dispersed 11.5 g (8.4 mmol) of Compound (1) and 3.80 g (8.4 mmol) of Compound (3), and 0.85 g (8.4 mmol) of piperidine were added. The resulting mixture was refluxed for 2 hours, and added with 100 ml of water to produce precipitates. The precipitates were filtered out, and recrystallized from acetonitrile. Thus, red Dye, D-28 was obtained as a red solid. The yield was 1.95 g (64%).

TABLE 1

| Dye | Maximum absorption wavelength | Molar extinction coefficient | Melting point (°C.) |
|---|---|---|---|
| D-10 | 520 nm | 59000 | 219–220 |
| D-14 | 538 nm | 76300 | 274–276 |
| D-24 | 491 nm | 51100 | 170–172 |

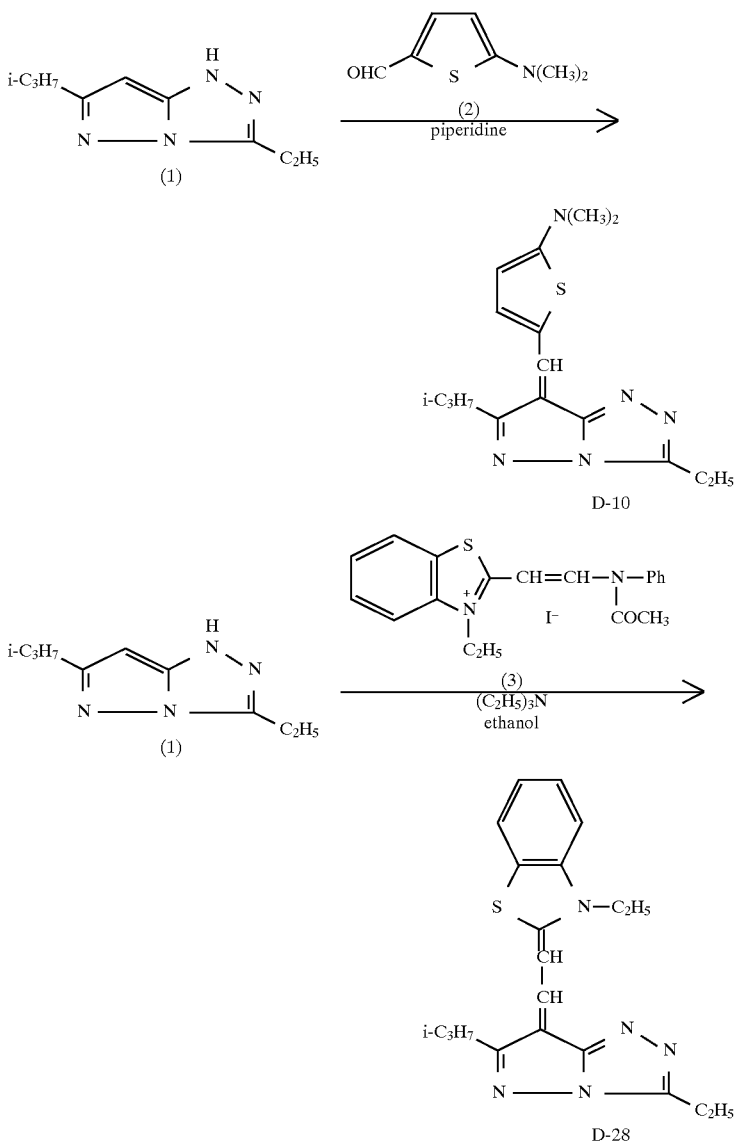

The maximum absorption wavelength, molar extinction coefficient and melting point of the typical dye synthesized in a similar manner as above are shown in Table 1. The absorption spectra of the dye were measured using an acetone solution.

TABLE 1-continued

| Dye | Maximum absorption wavelength | Molar extinction coefficient | Melting point (°C.) |
|---|---|---|---|
| D-28 | 520 nm | 78400 | 245–247 |
| D-50 | 483 nm | 80000 | 203–204 |
| D-51 | 484 nm | 71400 | 283–284 |

Next, a radical generating agent will be explained.

The radical generating agent in the invention is selected from the group consisting of an organic peroxide, an onium compound, a halogenated triazine, an iron arene complex, a bisimidazole and a titanocene compound.

As the orgnic peroxides, the peroxides disclosed in Japanese Patent O.P.I. Publication Nos. 59-1504 and 61-240807 can be used. Typical examples of the peroxides include ketone peroxides such as methylethyl ketone peroxide, methylisobutyl ketone peroxide, cyclohexanone peroxide, methylcyclohexanone peroxide and 3,3,5-trimethylcyclohexanone peroxide, diacyl peroxides such as acetylperoxide, propionylperoxide, isobutylperoxide, octanoylperoxide, 3,5,5-trimethylhexanoylperoxide, decanoylperoxide, lauroylperoxide, benzoylperoxide, p-chlorobenzoylperoxide, 2,4-dichlorobenzoylperoxide and acetylcyclohexanesulfonylperoxide, hydroperoxides such as tert-butylhydroperoxide, cumenehydroperoxide, diisopropylbenzene hydroperoxide, 2,5-dimethylhexane-2,5-dihydroperoxide and 1,1,3,3-tetrametylbutyl hydroperoxide, peroxyketals such as di-tert-butylperoxide, tert-butylcumylperoxide, 1,3-bis(tert-butylperoxyisopropyl) benzene, 2,5-di(tert-butylperoxy)-1,3,5-trimethylcyclohexane and butyl-4,4'-bis(tert-butylperoxy) butane, alkylperesters such as tert-butylperoxyacetate, tert-butylperoxyisobutylate, tert-butylperoxyoctate, tert-butylperoxypivalate, tert-butylperoxyneodecanate, tert-butylperoxy-3,5,5-trimethylhexanoate, tert-butylperoxybenzoate, di-tert-butylperoxyphthalate, di-tert-butylperoxyisophthalate, tert-butylperoxylaurate and 2,5-dimethyl-2,5-dibenzoylperoxyhexane, peroxycarbonates such as di-2-ethylhexylperoxydicarbonate, di-isopropylperoxydicarbonate, di-sec-butylperoxycarbonate, di-propylperoxydicarbonate, dimethoxy-isopropylperoxydicarbonate, di-3-methoxybutylperoxydicarbonate, di-ethoxyethylperoxydicarbonate, and bis-(4-tert-butylcyclohexyl)peroxydicarbonate, and water soluble peroxides such as succinic acid peroxide.

The especially preferable peroxide is an organic peroxide (BTTB) represented by the following formula:

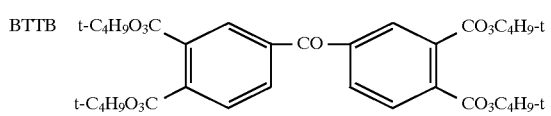

The metal arene complex used in the invention includes a titanocen compound and an iron arene complex. The iron arene complex includes those represented by the following formula:

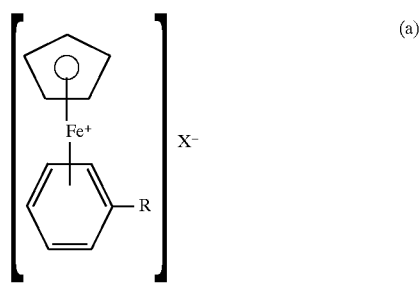

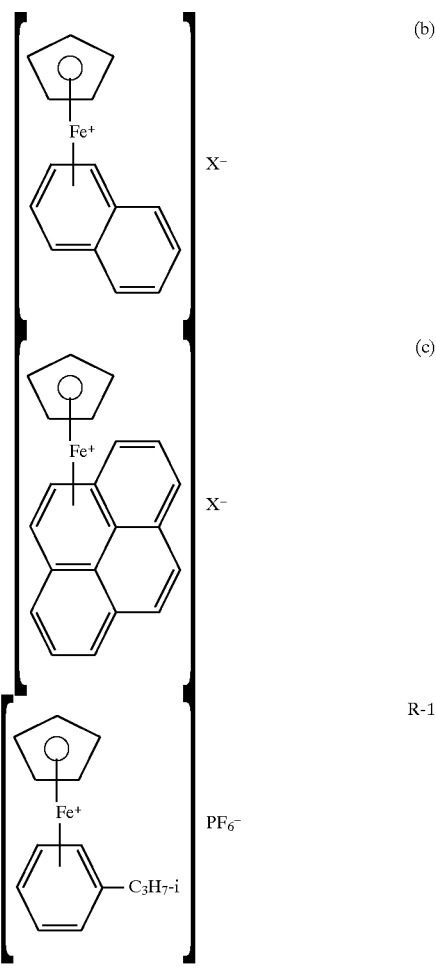

Of these compounds, Compound R-1 is especially preferable.

The titanocene compound is not specifically limited, but those disclosed in Japanese Patent O.P.I. Publication Nos. 59-152396 and 61-151197 can be cited. The typical titanocene compound includes di-cyclopentadienyl-Ti-dichloride, di-cyclopentadienyl-Ti-bisphenyl, di-cyclopentadienyl-Ti-bis- 2,3,4,5,6-pentafluorophenyl-1-yl, di-cyclopentadienyl-Ti-bis-2,3,5,6-tetrafluorophenyl-1-yl, di-cyclopentadienyl-Ti-bis-2,4,6-trifluorophenyl-1-yl, di-cyclopentadienyl-Ti-bis-2,6-difluorophenyl-1-yl, di-cyclopentadienyl-Ti-bis-2,4-difluorophenyl-1-yl, di-methylcyclopentadienyl-Ti-bis-2,3,4,5,6-pentafluorophenyl-1-yl, di-methylcyclopentadienyl-Ti-bis-2,3,5,6-tetrafluorophenyl-1-yl, di-methylcyclopentadienyl-Ti-bis-2,6-difluorophenyl-1-yl and di-methylcyclopentadienyl-Ti-bis-2,6-difluoro-3-(pyrrolyl-1-yl)-phenyl-1-yl (hereinafter referred to as Ti-l). Of these compounds, Ti-l is especially preferable. Ti-l is represented by the following formula:

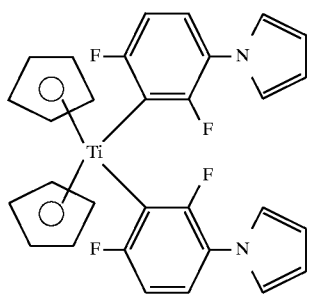

The onium salt used in the invention includes an iodonium salt, a sulfonium salt, a phosphonium salt and a stannonium salt. The various onium compounds disclosed in Japanese Patent Publication No. 55-39162 and Japanese Patent O.P.I. Publication No. 59-14023 and in Macromolecule, Vol. 10, p.1307 (1977) can be used.

As the iodonium salt, the aryliodonium salt is preferably used. The example includes a chloride, bromide, fluoroborate, hexafluoroborate, hexafluorophosphate, hexafluoroarsenate, hexafluoroantimonate, perchlorate, benzenesulfonate, p-toluenesulfonate, p-trifluoromethylbenzene sulfonate or boron butyl triphenyl salt of diphenyliodonium, ditolyliodonium, phenyl(p-methoxyphenyl)iodonium, bis(m-nitrophenyl)iodonium, bis(p-t-butylphenyl)iodonium or bis(p-cyanophenyl)iodonium.

The dimer of 2,4,5-triarylimidazole can be used in the invention. The dimers are disclosed in Japanese Patent O.P.I. Publication Nos. 55-127550 and 60-202437. Of these dimers, the especially preferable is a compound represented by the following formula:

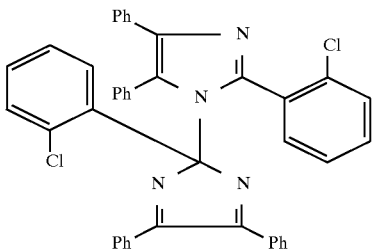

The addition amount of the radical generating agent is preferably 0.1 to 20 parts by weight, and more preferably 1 to 10 parts by weight, based on 100 parts by weight of a compound having at least one ethylenically unsaturated bond, although the amount varies on the usage conditions or kinds of radical generating agent.

The binder used in the light sensitive layer includes conventional binders. The example of the binders includes those disclosed in U.S. Pat. No. 4,072,527. The preferable binder is a copolymer of a monomer having an aromatic hydroxy group disclosed in Japanese Patent O.P.I. Publication No. 54-98613, for example, N-(4-hydroxphenyl) acrylamide, N-(4-hydroxyphenyl)methacrylamide or o-, m- or p-hydroxyphenyl-methacrylamide, with another monomer, a polymer of a hydroxyethylacrylate or hydroxy-ethylmethacrylate disclosed in U.S. Pat. No. 4,123,276, a natural resin such as shellac or rosin, polyvinyl alcohol, a polyamide resin disclosed in U.S. Pat. No. 3,751,257 and a linear polyurethane, a polyvinyl alcohol phthalate resin, an epoxy resin of bisphenol A and epichlorhydrin, a cellulose resin such as cellulose acetate or cellulose acetate phthalate disclosed in U.S. Pat. No. 3,660,097.

One or more of the above mentioned resins can be used as a binder resin. Of these resins, a solvent soluble polymers such as polyvinyl chloride, vinyl chloride-vinylacetate copolymer, an acryl resin, a methacryl resin, polystyrene, polycarbonate, polysulfone, polyethersulfone, polyvinyl butyral, styrene-acrylonitrile copolymer, polyvinyl acetal, nitrocellulose or ethylcellulose are preferable.

These binders may be used in solution employing one or more solvents or in latex dispersion. The amount used of the binder is preferably 1.0 to 20 $g/m^2$ of support, although different depending on whether the light sensitive layer is single layered or multi-layered.

Next, the ethylenically unsaturated compound will be explained.

As a polymerizable compound, a conventional monomer can be used without any limitations. The examples include a monofunctional acrylate such as 2-ethylhexylacrylate, 2-hydroxyethylacrylate or 2-hydroxypropylacrylate or its derivative or a methacrylate, itaconate, crotonate and maleate alternative of the above acrylate, a bifunctional acrylate such as polyethyleneglycoldiacrylate, pentaerythritoldiacrylate, bisphenol A diacrylate or diacrylate of an ε-caprolactone adduct of hydroxypivalic acid neopentylglycol or its derivative or a dimethacrylate, diitaconate, dicrotonate and dimaleate alternative of the above diacrylate, a polyfunctional acrylate such as trimethylolpropanetri(meth)acrylate, dipentaerythritolpentaacrylate, dipentaerythritolhexaaacrylate or pyrrogallol triacrylate or its derivative or a methacrylate, itaconate, crotonate and maleate alternative of the above acrylate. The prepolymer, in which acrylic acid or methacrylic acid is incorporated into a polymer having an appropriate molecular weight and photopolymerization is provided, is suitably used.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds disclosed on pages 286 to 294 "11290 Chemical Compounds" edited by Kagakukogyo Nipposha, and compounds disclosed on pages 11 to 65 of "UV.EB Koka Handbook (Materials)" edited by Kobunshi Kankokai can be suitably used.

Of these compounds, compounds having two or more acryl or methacryl groups in its molecule are preferable, and those having a molecular weight of not more than 10,000, preferably not more than 5,000 are preferable.

In the invention, these monomers or prepolymers can be used singly or in combination. The light sensitive layer contains those compounds in an amount of preferably 20 to 80 weight % and more preferably 30 to t0 weight %.

Other additives such as a sensitizer, a polymerization promoting agent, a thermal polymerization inhibitor, a heat fusible compound, an oxygen quencher and a plasticizer can be added to the sensitive layer in the invention, as long as the effect of the invention is jeopardized.

The polymerization promoting agent or chain transfer catalyst represented by amines or sulfur compounds (for example, thiols or disulfides) can be added to the light sensitive layer.

The polymerization promoting agent or chain transfer catalyst can be added to the photopolymerizable composition of the invention. The examples thereof includes amines such as N-phenyl glycine, triethanolamine, and N,N-diethylaniline, thiols as disclosed in U.S. Pat. No. 4,414,312 and Japanese Patent O.P.I. Publication No. 64-13144/1988, disulfides as disclosed in Japanese Patent O.P.I. Publication No. 2-291561/1990, thions as disclosed in U.S. Pat. No. 3,558,322 and Japanese Patent O.P.I. Publication No. 64-17048/1988, o-acylthiohydroxamate or N-alkoxypyridinethions as disclosed in Japanese Patent O.P.I. Publication No. 2-291560/1990. The preferable amine is N,N-diethylaniline, and the preferable sulfur compound is 2-mercaptobenzothizole. The composition of the invention may optionally contain dyes, organic or inorganic pigment, oxygen removing agents such as phosphines, phosphates and phosphites, a reducing agent, anti-foggants, an anti-fading agent, an anti-halation agent, a brightening agent, a surfactant, a coloring agent, fillers, a plasticizer, a non-flammable agent, an anti-oxidant, a UV absorbing agent, a forming agent, an anti-fungal, an tatic agent, magnetic substances, other additives giving other characteristics and a diluting agent.

The thermal polymerization inhibitor is preferably a quinone or phenol type compound, for example, hydroquinone, pyrogallol, p-methoxyphenol, catechol, β-naphtol or 2,6-di-t-butyl-p-cresol. The inhibitor content of the light sensitive layer is not more than 10 parts by weight, and preferably 0.01 to 5 parts by weight based on the 100 parts by weight of a polymerizable ethylenically unsaturated compound and a binder.

The oxygen quencher is preferably an N,N-dialkylaniline derivative, for example, a compound disclosed in column 11, line 58 to column 12, line 35 of U.S. Pat. No. 4,772,541.

The plasticizer includes phthalates, trimellitates, adipates, or another saturated or unsaturated carboxylate, citrates, epoxidated soybean oil, epoxidated linseed oil, epoxidated stearic acids, phosphates, phosphites, and glycol esters.

The heat fusible solvent includes compounds which are solid at ordinary temperature and thermally reversibly liquefies or softens. The example thereof includes alcohols such as terpineol, menthol, 1,4-cyclohexanediol and phenol, amides such as acetoamide and benzamide, cumarine, esters such as benzyl cinnamate, ethers such as diphenylether and crown ether, ketones such as camphor and p-methylacetophenone, aldehydes such as vanillin and dimethoxybenzaldehyde, hydrocarbons such as norbornene and stilbene, a higher fatty acid such as margaric acid, a higher alcohol such as eicosanol, a higher fatty acid ester such as cetylpalmitate, a higher fatty acid amide such as stearic amide, a higher fatty acid amine such as behenylamine, waxes such as bees wax, candelilla wax, paraffin wax, ester wax, montan wax, carnauba wax, amide wax, polyethylene wax and microcrystalline wax, rosin derivatives such as ester gum, rosin-maleic acid resins and rosin phenol resins, a phenol resin, a ketone resin, an epoxy resin, a diallylphthalate resin, a terpene type hydrocarbon resin, a cyclopentadiene resin, a polyolefin resin, a polycaprolactam resin, and polyethylene oxides such as polyethylene glycol and polypropylene glycol.

The light sensitive layer may optionally contain an anti-oxidant, a filler or an anti-static agent.

The anti-oxidant includes a chromane compound, phenol derivatives, hydroquinone derivatives, hindered amine derivatives, spiroindanes, sulfur-containing compounds, phosphor-containing compounds, compounds disclosed in Japanese Patent O.P.I. Publication Nos. 59-182785/1984, 60-130735/1985, 61-159644/1986 and 1-127389/1989, and compounds disclosed in Kagakukogyo Nipposha, "11290 Chemical Compounds", pages 862 to 868 and compounds well known as those improving durability of photographic or other image forming materials.

The filler includes inorganic or organic fine particles. The inorganic fine particles include silica gel, calcium carbonate, zinc oxide, barium sulfate, talc, clay, kaorine, Japanese acid clay, activated clay and alumina. The organic fine particles include fluorine-containing resin particles, guanamine resin particles, acryl resin particles, and silicone resin particles. The anti-static agent include a cationic surfactant, an anionic surfactant, a nonionic surfactant, a polymer anti-static agent, conductive fine particles and compounds disclosed on pages 875 and 876 of Kagakukogyo Nipposha, "11290 Chemical Compounds".

The light sensitive layer in the invention may be a single layer or plural layers. The plural light sensitive layers may be different in composition from each other and may comprise a light sensitive layer containing no colorant. The thickness of the light sensitive layer is preferably 0.2 to 10 $\mu$m and more preferably 0.5 to 5 $\mu$m.

The light sensitive layer is formed by dissolving or dispersing the light sensitive layer composition in a solvent to obtain a coating solution, coating the solution on a support described later and then drying.

The support of light sensitive material includes paper, synthetic paper (for example, synthetic paper made mainly of polypropylene), a resin film or sheet, a plastic film or sheet having two or more layers laminated, a film or sheet in which a resin layer is laminated on various polymer materials, metals, ceramics or paper made of tree pulp. cellulose pulp or sulfite pulp.

The resin constituting the resin film or sheet includes a an acryl resin such as acrylate or methacrylate, a polyester such as polyethylene terephthalate, polybutylene terephthalate, polyethylene naphthalate, polycarbonate or polyarylate, polyvinyl chloride, polyvinylidene chloride, polyvinylidene fluoride, polyolefin such as polyethylene or polyethylene, polypropylene, polystyrene, nylon, polyamide such as aromatic polyamide, polyether ketone, polysulfone, polyethersulfone, polyimide, polyetherimide, polyparabanic acid, a phenoxy resin, an epoxy resin, a urethane resin, a melamine resin, an alkyd resin, a phenol resin, a fluorine-containing resin and a silicone resin.

The support of the presensitized planographic printing plate of the invention, on which the light sensitive layer is provided, includes a metal plate such as aluminium, zinc, steel or copper, a metal plate, paper sheet, plastic film or glass plate which is plated or vacuum evaporated with chromium, zinc, copper, nickel, aluminium or iron, a paper sheet coated with a resin, a paper sheet laminated with a metal foil such as aluminium and a plastic film subjected to hydrophilic treatment. Of these, an aluminium plate is preferable.

The support is preferably an aluminium plate which is subjected to a surface treatment such as graining treatment, anodizing treatment or sealing treatment. The surface treatment is carried out by a conventional method.

The graining treatment includes a mechanically graining method and an electrolytically etching method. The mechanically graining method includes a ball graining method, a brush graining method, a liquid horning graining method and a buff graining method. The above methods can be used singly or in combination according to an aluminium material composition. The electrolytically etching method is preferable. The electrolytically etching is carried out in a bath containing one or more of phosphoric acid, sulfuric acid, hydrochloric acid and nitric acid. After graining, the surface of the support is optionally subjected to desmut treatment using an alkaline or acid solution to neutralize and washed with water.

The anodizing is carried out by electrolyzing the surface of the aluminium support using the aluminium plate as an anode in a solution containing one or more of sulfuric acid, chromic acid, oxalic acid, phosphoric acid and malonic acid. The thickness of the anodizing film formed is suitably 1 to 50 mg/dm$^2$, and preferably 10 to 40 mg/dm$^2$. The thickness of the anodizing film is obtained by immersing the anodized aluminium in a solution containing phosphoric acid and chromic acid to dissolve the anodized film and measuring the aluminium weight before and after the immersing.

The sealing is carried out by treating the aluminium support with a boiling water, steam, a sodium silicate solution or a dichromic acid solution The thickness of the support is ordinarily 3 to 1000 μm, and preferably 8 to 300 μm.

The solvent includes water, alcohols (such as ethanol and propanol), cellosolves (such as methyl cellosolve and ethyl cellosolve), aromatic hydrocarbons (such as toluene, xylene and chlorobenzene), ketones (such as acetone and methylethylketone), esters (such as ethyl acetate and butyl acetate), ethers (such as tetrahydrofurane and dioxane), halogenated hydrocarbons (such as chloroform and trichloroethylene), amides (such as dimethylformamide and N-methylpyrrolidone) and dimethylsulfoxide.

The coating method includes a gravure coating method, an extrusion coating method, a wire bar coating method and a roller coating method.

EXAMPLES

Next, the present invention will be explained in the examples. In the examples, "parts" represents parts by weight, unless otherwise specified.

EXAMPLES 1 THROUGH 4

(Preparation of support)

A 0.24 mm thick aluminium plate (material 1050, quality H16) was degreased at 60° C. for one minute in a 5% sodium hydroxide solution, washed with water, immersed at 25° C. for one minute in 10% hydrochloric acid solution to neutralize and then washed with water. The resulting plate was electrolytically etched using an alternating current at 25° C. for 60 seconds at a current density of 100 A/dm$^2$ in a 1.0 weight % hydrochloric acid solution, desmut at 60° C. for 10 seconds in a 5% sodium hydroxide solution. The desmut plate was anodized at 30° C. for 6 minutes at a current density of 4 A/dm$^2$ in a 40% phosphoric acid solution, and sealed using a sodium silicate solution. Thus, an aluminium support for a planographic printing plate was obtained.

(Light sensitive layer coating)

The aluminium plate was coated with the following light sensitive layer composition and dried at 80° C. for 3 minutes to give a light sensitive layer having a coating thickness of 1.3 g/m$^2$.

| Light sensitive layer composition | |
|---|---|
| Dye (Exemplified Dye D-28) | 0.2 parts |
| Pentaerythritoltetraacrylate M450 | 4.47 parts |
| (produced by Toa Gosei Co., Ltd.) | |
| Fluorine-containing surfactant | 0.10 parts |
| (Megafax F179, produced by Dainihon Ink Co., Ltd.) | |
| Polymerization inhibitor | 0.02 parts |
| (Sumirizer GS, produced by Sumitomo Kagaku Co., Ltd.) | |
| Methylethyl ketone | 45 parts |
| Propylene glycol monomethyl ether | 45 parts |

| -continued | |
|---|---|
| Light sensitive layer composition | |
| Copper-phthalocyanine pigment | 0.58 parts |
| (particle size of 0.3 μm) | |
| (Protective layer coating) | |

On the light sensitive layer was coated the following protective layer composition and dried at 80° C. for 3 minutes to give a protective layer having a coating thickness of 1.3 g/m$^2$. Thus, photopolymerization type presensitized planographic printing plate sample No. 1 was obtained.

| (Protective layer composition) | |
|---|---|
| Polyvinyl alcohol Gosenol GL-05 | 9.9 parts |
| (produced by Nihongosei Kagaku Co., Ltd.) | |
| Fluorine-containing surfactant | 0.1 parts |
| (Megafax F120, produced by Dainihon Ink Co. Ltd.) | |
| Water | 90 parts |

Sample Nos. 2 through 4 were prepared in the same manner as in sample No. 1, except that the dye was changed to those shown in Table 2.

EXAMPLES 5 THROUGH 30

Sample No. 5 was prepared in the same manner as in sample No. 1, except that the following light sensitive layer composition was used instead of the sample No. 1 light sensitive layer composition.

| Light sensitive layer composition | |
|---|---|
| Dye (Exemplified Dye D-28) | 0.20 parts |
| Radical generating agent (BTTB) | 0.40 parts |
| Pentaerythritoltetraacrylate M450 | 4.47 parts |
| (produced by Toa Gosei Co., Ltd.) | |
| Polymerization promoting agent 1 | 0.45 parts |
| (Iron-arene complex) | |
| Polymerization promoting agent 2 | 0.083 parts |
| (mercaptobenzoxazole) | |
| Fluorine-containing surfactant | 0.10 parts |
| (Megafax F179, produced by Dainihon Ink Co., Ltd.) | |
| Polymerization inhibitor | 0.02 parts |
| (Sumirizer GS, produced by Sumitomo Kagaku Co., Ltd.) | |
| Methylethyl ketone | 45 parts |
| Propylene glycol monomethyl ether | 45 parts |
| Copper-phthalocyanine pigment | 0.58 parts |
| (particle size of 0.3 μm) | |

Sample Nos. 6 through 30 were prepared in the same manner as in sample No. 5, except that the dye, radical generating agent, polymerization promoting agent 1 or polymerization promoting agent 2 was changed to those shown in Table 2.

Comparative Examples 1 through 5

Comparative sample Nos. 1 through 5 were prepared in the same manner as in sample No. 5, except that the dye, radical generating agent, polymerization promoting agent 1 or polymerization promoting agent 2 was changed to those shown in Table 2.

The constitutions of samples Nos. 1 through 30 and comparative samples Nos. 1 through 5 are shown in Table 2.

TABLE 2

| Sample No. | Dye | Radical generating agent | Addition amount (parts) | Polymerization promoting agent (1) | Addition amount (parts) | (2) | Addition amount (parts) |
|---|---|---|---|---|---|---|---|
| Example 1 | — | — | — | — | — | — | — |
| Example 2 | D-2 | — | — | — | — | — | — |
| Example 3 | D-29 | — | — | — | — | — | — |
| Example 4 | D-42 | — | — | — | — | — | — |
| Example 5 | D-37 | BTTB | 0.40 | — | — | — | — |
| Example 6 | D-28 | DPI | 0.40 | — | — | — | — |
| Example 7 | D-28 | TCT | 0.40 | — | — | — | — |
| Example 8 | D-28 | Bisimidazole | 0.40 | — | — | — | — |
| Example 9 | D-28 | R-1 | 0.40 | — | — | — | — |
| Example 10 | D-28 | Titanocene | 0.40 | — | — | — | — |
| Example 11 | D-28 | Boronium | 0.40 | — | — | — | — |
| Example 12 | D-28 | BTTB | 0.40 | R-1 | 4.0 | PMA | |
| Example 13 | D-28 | BTTB | 0.40 | R-1 | 4.0 | MBO | |
| Example 14 | D-6 | BTTB | 0.40 | — | — | — | — |
| Example 15 | D-6 | TCT | 0.40 | — | — | — | — |
| Example 16 | D-6 | BTTB | 0.40 | — | — | — | — |
| Example 17 | D-7 | BTTB | 0.40 | — | — | — | — |
| Example 18 | D-10 | BTTB | 0.40 | — | — | — | — |
| Example 19 | D-12 | BTTB | 0.40 | — | — | — | — |
| Example 20 | D-13 | BTTB | 0.40 | — | — | — | — |
| Example 21 | D-14 | BTTB | 0.40 | — | — | — | — |
| Example 22 | D-16 | BTTB | 0.40 | — | — | — | — |
| Example 23 | D-19 | BTTB | 0.40 | — | — | — | — |
| Example 24 | D-20 | BTTB | 0.40 | — | — | — | — |
| Example 25 | D-29 | BTTB | 0.40 | — | — | — | — |
| Example 26 | D-29 | TCT | 0.40 | R-1 | 4.0 | | 4.0 |
| Example 27 | D-29 | BTTB | 0.40 | R-1 | 4.0 | | 4.0 |
| Example 28 | D-29 | BTTB | 0.40 | — | — | — | — |
| Example 29 | D-37 | BTTB | 0.40 | — | — | — | — |
| Example 30 | D-42 | BTTB | 0.40 | — | — | — | — |
| Comparative example 1 | Comparative dye 1 | BTTB | 0.40 | — | — | — | — |
| Comparative example 2 | Comparative dye 1 | BTTB | 0.40 | R-1 | 4.0 | — | |
| Comparative example 3 | Comparative dye 1 | BTTB | 0.40 | R-1 | 4.0 | MBO | 4.0 |
| Comparative example 4 | Comparative dye 2 | BTTB | 0.40 | — | — | — | — |
| Comparative example 5 | Comparative dye 3 | BTTB | 0.40 | — | — | — | — |

DPI: $(C_6H_5)_2I^+ \cdot PF_6^-$
MBO: 2-Mercaptobenzoxazole
TCT

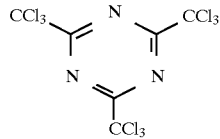

PMA

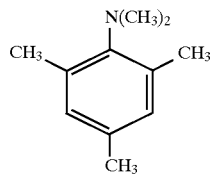

Titanocene

TABLE 2-continued

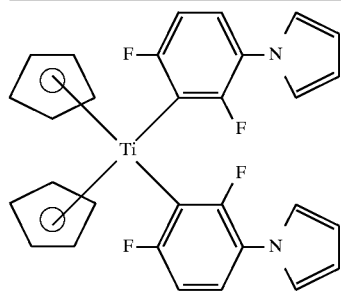

Boronium salt

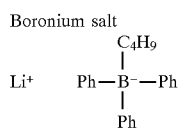

Comparative dye 1

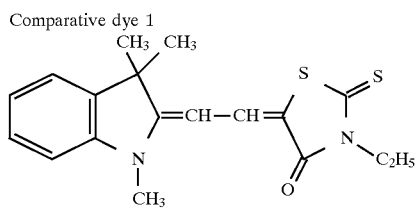

Comparative dye 2

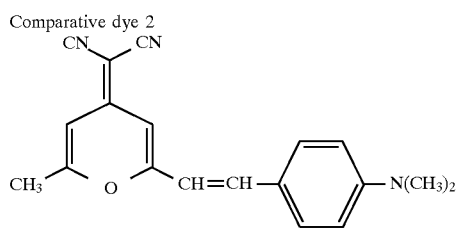

Comparative dye 3

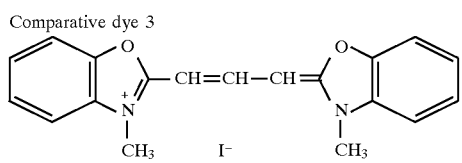

(Image forming)

The above obtained sample was imagewise exposed employing a roomlight printer P-627-HA (produced by Dainihon Screen Co., Ltd.), immersed with the following developer at 30° C. for 30 seconds to dissolve out the unexposed light sensitive layer, washed with water and dried to form an image.

| Developer composition | |
|---|---|
| Potassium silicate A | 400 parts |
| ($SiO_2$ = 26%, $K_2O$ = 13.5% produced by Nihon Kagakukogyo Co., Ltd.) | |
| Potassium hydroxide | 195 parts |
| (50% aqueous solution) | |
| N-phenylethanolamine | 6 parts |
| Propylene glycol | 50 parts |
| P-tert-butyl benzoic acid | 150 parts |
| Potassium sulfite | 300 parts |
| Nonionic surfactant Emulgen 147 | 5 parts |
| (produced by Kao Co., Ltd.) | |
| Gluconic acid (50% aqueous solution) | 100 parts |

-continued

| Developer composition | |
|---|---|
| Triethanolamine | 25 parts |
| Water | 11500 parts |

The developer was adjusted to pH 12.5.

The thus obtained printing plate was evaluated according to the following criteria.

<<Evaluation of stain>>

An image was prepared using Ugra plate control wedge PCW82 (made by Mika Denshi Co.) with an exposure amount necessary to give a continuous tone wedge of 3 steps, and then printing was conducted on a printing machine (Heidel GTO) wherein a coated paper, printing ink (Hyplus M magenta made by Toyo Ink Manufacturing Co., Ltd.) and dampening water (2.5% SEU-3 aqueous solution made by Konica Corp.) were used. Stain on a non-image area of a print at the initial stage in printing (at a point of about 1000 prints) was evaluated according to the following three evaluation criteria.

A: No stain on a non-image area of a print
B: Occurrence of slight stain on a non-image area of a print
C: Occurrence of stain on a non-image area of a print <<Evaluation of sensitivity>>

The presensitized printing plate was wound around a drum so that the protective layer faces the light source, and was exposed to a 100 mW YAG laser (DRY315M, KD exitation SHG, YAG laser (532 nm): produced by ADLAS Co., Ltd.) while the drum was rotating. While the drum rotation rate was kept constant, light intensity ($\overline{MW}/cm^2$), wherein a line width of the formed image is the same as width corresponding to $1/e^2$ of intensity of the laser beam, was determined under the assumption that the laser beam intensity was on Gaussian distribution, and multiplied by irradiation time to obtain an energy value (sensitivity). Similarly, employing a 488 nm argon laser, energy value (sensitivity) of the presensitized printing plate was also obtained.

<<Evaluation of storage stability>>

The presensitized printing plate was stored under the condition of 55° C. and 20% RH for 3 days. After that, the resulting presensitized printing plate was subjected to exposure and development as described above, and sensitivity was obtained in the same manner as above.

The results are shown in Table 3.

TABLE 3

| Sample No. | 488 nm Sensitivity (mJ) | 488 nm Sensitivity after storage | 532 nm Sensitivity (mJ) | 532 nm Sensitivity after storage | stain |
|---|---|---|---|---|---|
| Example 1 | | | 6 | 8 | A |
| Example 2 | 7 | 9 | | | A |
| Example 3 | | | 7 | 9 | A |
| Example 4 | 9 | 10 | 7 | 8 | A |
| Example 5 | 0.15 | 0.15 | 0.1 | 0.1 | B |
| Example 6 | 0.25 | 0.25 | 0.09 | 0.09 | A |
| Example 7 | 0.15 | 0.18 | 0.1 | 0.12 | A |
| Example 8 | 0.3 | 0.34 | 0.12 | 0.12 | A |
| Example 9 | 0.2 | 0.24 | 0.15 | 0.18 | A |
| Example 10 | 0.25 | 0.32 | 0.18 | 0.25 | B |
| Example 11 | 0.2 | 0.22 | 0.14 | 0.24 | B |
| Example 12 | 0.09 | 0.09 | 0.07 | 0.07 | A |
| Example 13 | 0.09 | 0.09 | 0.07 | 0.07 | A |
| Example 14 | 6 | 8 | | | B |
| Example 15 | 6 | 9 | | | B |
| Example 16 | 1.9 | 4 | | | B |
| Example 17 | 7 | 8 | | | B |
| Example 18 | 1.25 | 3.25 | 0.85 | 2.9 | A |
| Example 19 | 0.8 | 0.95 | | | A |
| Example 20 | 0.56 | 0.67 | | | A |
| Example 21 | 0.85 | 0.95 | 0.45 | 0.55 | A |
| Example 22 | 0.64 | 0.78 | | | A |
| Example 23 | 2 | 3 | | | B |
| Example 24 | 3 | 3 | | | B |
| Example 25 | 4.54 | 9 | | | B |
| Example 26 | 1.25 | 1.34 | | | B |
| Example 27 | 1.25 | 1.34 | | | B |
| Example 28 | 0.2 | 0.6 | 1.25 | 3.5 | B |
| Example 29 | 0.25 | 0.25 | 0.13 | 0.14 | |
| Example 30 | | | 0.9 | 1.2 | |
| Comparative example 1 | 4 | — | 3 | — | C |
| Comparative example 2 | 4 | — | 3 | — | C |
| Comparative example 3 | 3 | — | 3 | — | C |
| Comparative example 4 | 2 | 4 | — | — | C |
| Comparative example 5 | 2.5 | 5 | — | — | C |

"—" in Table 3 shows that sensitivity could not be measured due to poor sensitivity.
Blank in Table 3 means that tests were not carried As is apparent from Table 3, the inventive samples are superior in sensitivity or stain to the comparative samples. Particularly, the samples using the dye of the invention and the radical generating agent provide high sensitivity with no stain occurrence.

What is claimed is:

1. A photopolymerizable composition comprising a compound having an ethylenically unsaturated bond and a dye represented by the following formula (1) or (2):

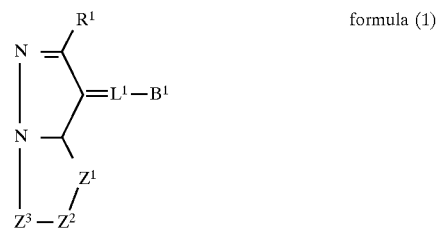

formula (1)

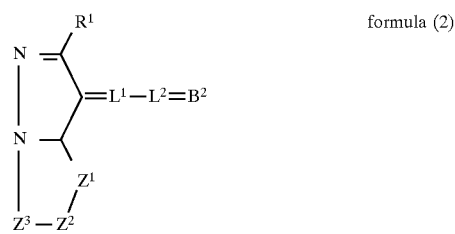

formula (2)

wherein $Z^1$, $Z^2$ and $Z^3$ independently represent —N= or —C($R^2$)=; $R^1$ and $R^2$ independently represent a hydrogen atom, an alkyl group, an alkenyl group, an aryl group or a 5- or 6-membered heterocyclic ring residue; $L^1$ and $L^2$ independently represent a methine group; and $B^1$ and $B^2$ independently represent an aryl group or a 5- or 6-membered heterocyclic ring residue.

2. The photopolymerizable composition of claim 1, wherein the dye content of the composition is 0.1 to 20 parts by weight based on the 100 parts by weight of the compound.

3. The photopolymerizable composition of claim 1, further containing a radical generating agent.

4. The photopolymerizable composition of claim 3, wherein the radical generating agent content of the composition is 0.01 to 10 parts by weight based on the 100 parts by weight of the compound.

5. The photopolymerizable composition of claim 3, wherein the radical generating agent is selected from the group consisting of an organic peroxide, an onium compound, a halogenated triazine, an iron arene complex, a bisimidazole and a titanocene compound.

6. The photopolymerizable composition of claim 1, further containing an amine compound as a polymerization promoting agent.

7. The photopolymerizable composition of claim 1, further containing a sulfur compound as a polymerization promoting agent.

8. The photopolymerizable composition of claim 1, wherein the dye is represented by the following formula (G):

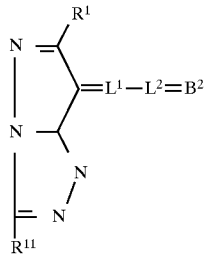

formula (G)

wherein $R^1$ and $R^{11}$ independently represent a hydrogen atom, an alkyl group, an alkenyl group, an aryl group or a 5- or 6-membered heterocyclic ring residue; $L^1$ and $L^2$ independently represent a methine group; and $B^2$ represents an aryl group or a 5- or 6-membered heterocyclic ring residue.

9. A presensitized planographic printing plate comprising a support and provided thereon, a light sensitive layer comprising a compound having an ethylenically unsaturated bond and a dye represented by the following formula (1) or (2):

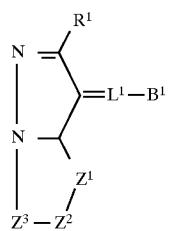

formula (1)

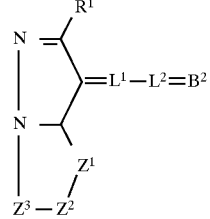

formula (2)

wherein $Z^1$, $Z^2$ and $Z^3$ independently represent —N= or —C($R^2$)=; $R^1$ and $R^2$ independently represent a hydrogen atom, an alkyl group, an alkenyl group, an aryl group or a 5- or 6-membered heterocyclic ring residue; $L^1$ and $L^2$ independently represent a methine group; and $B^1$ and $B^2$ independently represent an aryl group or a 5- or 6-membered heterocyclic ring residue.

* * * * *